(12) United States Patent
Mehrotra

(10) Patent No.: US 7,659,614 B2
(45) Date of Patent: Feb. 9, 2010

(54) HIGH TEMPERATURE, STABLE SIC DEVICE INTERCONNECTS AND PACKAGES HAVING LOW THERMAL RESISTANCE

(76) Inventor: Vivek Mehrotra, 1800 W. Hillcrest Dr., #302, Newbury Park, CA (US) 91320

( * ) Notice: Subject to any disclaimer, the term of this patent is extended or adjusted under 35 U.S.C. 154(b) by 0 days.

(21) Appl. No.: 12/116,916

(22) Filed: May 7, 2008

(65) Prior Publication Data

US 2008/0211104 A1    Sep. 4, 2008

Related U.S. Application Data

(62) Division of application No. 11/031,435, filed on Jan. 7, 2005, now Pat. No. 7,390,735.

(51) Int. Cl.
*H01L 23/12* (2006.01)
(52) U.S. Cl. .................. 257/705; 257/772; 257/E23.02
(58) Field of Classification Search .................. 257/772
See application file for complete search history.

(56) References Cited

U.S. PATENT DOCUMENTS

| 3,678,570 A | 7/1972 | Paulonis et al. |
| 3,753,794 A | 8/1973 | Paulonis et al. |
| 3,935,986 A | 2/1976 | Lattari et al. |
| 4,988,035 A | 1/1991 | Ueno et al. |
| 5,038,996 A | 8/1991 | Wilcox et al. |
| 5,432,998 A | 7/1995 | Galasco et al. |
| 5,759,737 A | 6/1998 | Feilchenfeld et al. |
| 5,897,341 A | 4/1999 | Love et al. |
| 5,985,692 A | 11/1999 | Poenisch et al. |
| 6,066,808 A | 5/2000 | Kresge et al. |
| 6,330,967 B1 | 12/2001 | Milewski et al. |
| 6,429,388 B1 | 8/2002 | Interrante et al. |
| 6,550,665 B1 | 4/2003 | Parrish et al. |
| 6,555,762 B2 | 4/2003 | Appelt et al. |
| 2002/0090756 A1 | 7/2002 | Tago et al. |
| 2002/0171157 A1* | 11/2002 | Soga et al. .................. 257/783 |
| 2004/0050912 A1 | 3/2004 | Spencer |
| 2005/0072835 A1 | 4/2005 | Choi et al. |

FOREIGN PATENT DOCUMENTS

| DE | 4303790 | 8/1994 |
| DE | 19532251 | 3/1997 |
| EP | 0365807 | 5/1990 |
| TW | 221023 | 9/2004 |

OTHER PUBLICATIONS

International Search Report for PCT/US2006/000090 mailed Oct. 27, 2006.

(Continued)

*Primary Examiner*—Stephen W Smoot

(57) ABSTRACT

A method of forming packages containing SiC or other semiconductor devices bonded to other components or conductive surfaces utilizing transient liquid phase (TLP) bonding to create high temperature melting point bonds using in situ formed ternary or quaternary mixtures of conductive metals and the devices created using TLP bonds of ternary or quaternary materials. The compositions meet the conflicting requirements of an interconnect or joint that can be exposed to high temperature, and is thermally and electrically conductive, void and creep resistant, corrosion resistant, and reliable upon temperature and power cycling.

18 Claims, 11 Drawing Sheets

OTHER PUBLICATIONS

Campbell, et al., "Materials Science and Engineering Laboratory National Institute of Standards & Technology", Metallurgy Division Annual Report 1998.

Johnson, "Current state-of-the-art and future prospects for power semiconductor devices in power transmission & distribution applications", Intern.Journal Elect., V90, 2003.

Search Report ROC 095100689, Jan. 26, 2007.

* cited by examiner

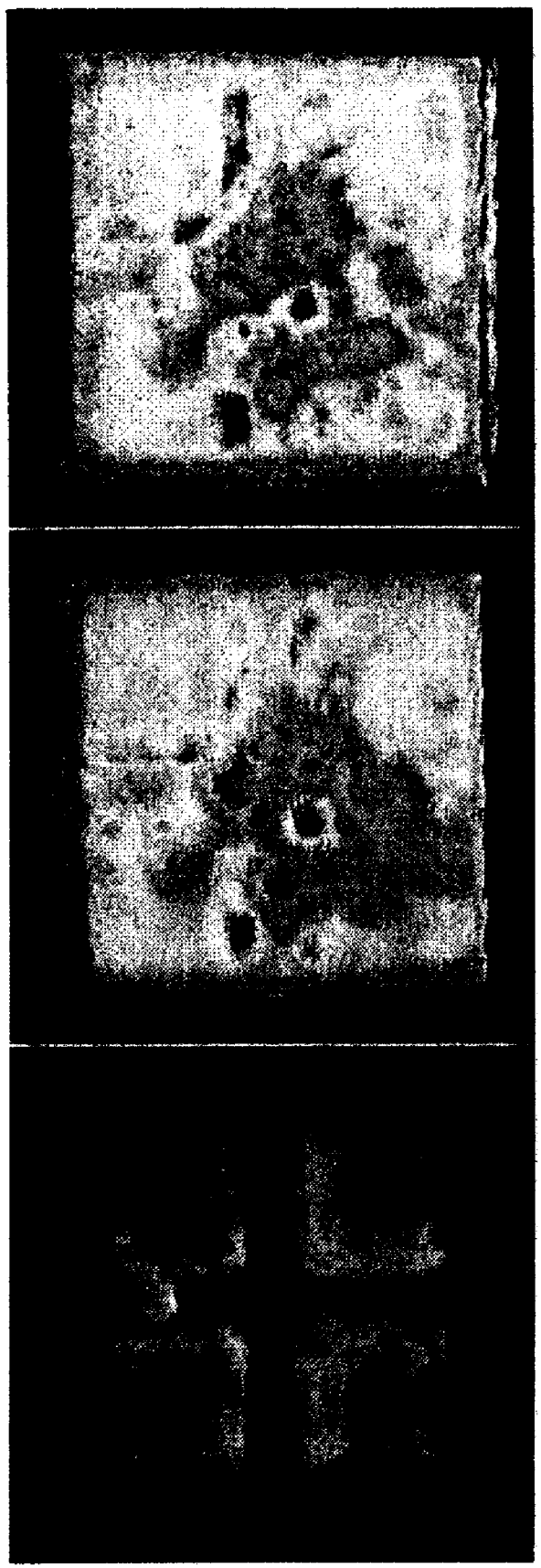
FIG. 10c 1500 Cycles
FIG. 10b 1000 Cycles
FIG. 10a As fabricated

HIGH TEMPERATURE, STABLE SIC DEVICE INTERCONNECTS AND PACKAGES HAVING LOW THERMAL RESISTANCE

This is a Divisional application which claims the benefit of application Ser. No. 11/031,435, filed Jan. 7, 2005 (now U.S. Pat. No. 7,390,735).

This invention was made with Government support under Contract F33615-02-2-2230 awarded by the U.S. Air Force, Air Force Research Laboratory (AFRL). The Government has certain rights in this invention.

This application is directed to a method of forming high-temperature resistant, mechanically robust, and low thermal and electrical resistance bonds for use in electronic devices, particularly silicon carbide or gallium nitride-based power electronics, with component attachments stable under elevated operating temperatures. The application is also directed to a method of attaching solid state light emitting devices to substrates that leads to a substantial reduction in the operating temperature and hence increases the light output.

BACKGROUND

Silicon carbide based power electronic systems offer significantly reduced size, weight and volume, a 65% volume reduction in a motor drive, for example, over other available systems. Because of the reliability of their device junctions, however, currently available SiC based electronic packages are generally limited to a junction operating temperature of less than about 150° C. These devices are typically assembled using conventional solder materials and techniques to form an electrically conductive path between metal contacts on package substrates. At higher temperatures and during temperature cycling, these soldered connections tend to be unstable, either from operation of the device or the surrounding environment in which the device operates. This causes voids and ultimately debonding in the interconnects, resulting in increased thermal resistance and unreliable operation of the electronics. Thermal resistance can be large due to thick (>1 mil) die attachments and inherently lower thermal conductivity (<40 W/m-K) of the attachment materials. Thermal resistance further increases dramatically during the life of the component due to voiding, which leads to increased device temperatures and accelerates failures. While brazing can form more reliable connections, the higher temperatures need to form the connection (700-1000° C.) can damage the components and devices being assembled. The requirements of high temperature operation, thermal and electrical conductivity, void and creep resistance, and corrosion resistance in devices with joints having low thermal resistance are often in conflict with each other when solder, binary compositions, or brazing materials are used.

TLP bonding can also be used to improve the performance of light-emitting devices. It lowers the device operating temperature due to lower thermal resistance of the bond, resulting in increased light output. It also results in increased mechanical robustness and maintenance of light output through the operating lifetime of the device due to minimal bond degradation during thermal and power cycling and extended operation.

An approach that has been suggested to provide connections between components that are stable at higher temperatures is a bonding process referred to as transient liquid phase (TLP) bonding, which can be accomplished at lower temperatures (less than about 300° C.). Transient liquid phase bonding starts with the use of a high melting point first metal as a contact. A film of a second metal of a much lower melting point is placed on the first metal. The two metals form a system, with the combination of the metals at specific concentrations having an elevated melting point greater than the melting points of the second metal. In U.S. Pat. No. 5,038,996 the metals are then heated to a temperature above the melting point of the mixture, causing an interdiffusion of the metals, forming a bond. The '996 patent discloses the formation of Pb—Sn or Sn—Bi TLP bonded connections between copper leads or surface pads.

U.S. Pat. No. 5,897,341 discloses methods for fabricating semiconductor devices, particularly multi-chip modules, including methods for forming interconnections between an integrated circuit chip and a substrate by solid-state diffusion bonding of dissimilar metals. In particular, a layer of cadmium, gallium, nickel, tin or zinc is formed over aluminum or aluminum coated pads by typical metal deposition techniques, such as evaporation, sputtering, CVD, electroplating or electroless plating. Bonding is then accomplished by solid-state diffusion at 100-150° C. to create a diffusion bond.

The preceding methods, as well as other methods in the prior art, lack the reliability and thermal resistance required for wide band gap (SiC and GaN) based power electronics.

SUMMARY

Interconnect and packaging techniques for SiC based electronic devices capable of operating reliably for extended periods of time when exposed to temperatures up to about 400° C., in particular, continuous operation at 200-400° C., as well as cycling from sub-zero temperatures (e.g. −55° C.) to elevated temperatures (e.g., 400° C.) under high voltage and currents and the method of forming these interconnects are disclosed. The process utilizes transient liquid phase (TLP) bonding to attach SiC based electronic devices to metallized substrates, particularly bonds formed from ternary or quaternary mixtures of Ag, Au, Sn and In on copper or nickel contacts. Devices with high temperature, thermally and electrically conductive, void and creep resistant, and corrosion resistant joints with lower thermal resistance that outperform the typical solder, brazing and binary TLP materials are obtained.

DESCRIPTION OF DRAWINGS

FIGS. 10a, 10b and 10c are acoustic scans showing a ternary Au—Sn—Ag TLP-packaged SiC diode viewed prior to thermal cycling, after 1000 and 1500 thermal

DESCRIPTION

Techniques and materials are disclosed for forming electrically conductive attachments between components in wide band gap devices (diodes, transistors, lasers, and integrated circuits). The techniques described are particularly directed to devices for attachment of silicon carbide (SiC) devices but are also applicable to devices based on gallium nitride (GaN), aluminum gallium nitride, indium nitride (InN), gallium arsenide (GaAs) and indium phosphide (InP) and/or alloys thereof, and other materials typically used in high power and high frequency applications. The technique is also applicable to silicon devices, where the low thermal resistance and reliability of the joint can be utilized. The methods disclosed also allow two sided high temperature contacts and eliminate the need for conventional wire bonding.

Figure 1:
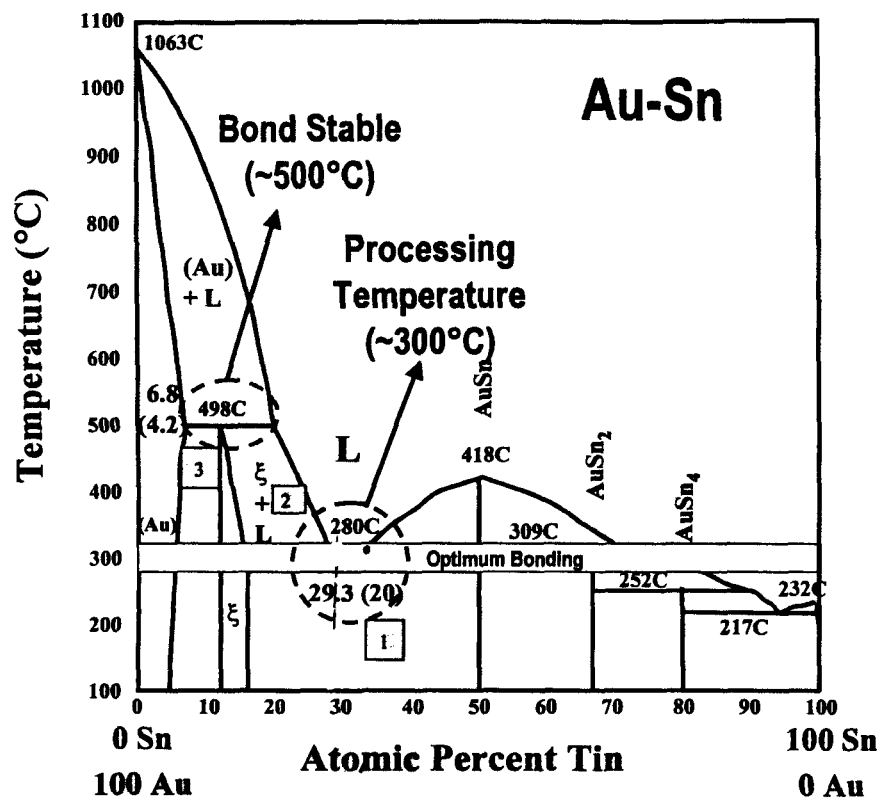
FIG. 1 is a phase diagram showing the melt temperatures of compositions containing Sn and Au.

In a preferred method, the bond between components is accomplished by forming a ternary or quaternary transient liquid-phase bond taking advantage of the stability, reliability, resistance to voiding, and low thermal resistance of the high temperature compositions formed by the combination of three or four of In, Sn, Ag and Au. Prior techniques utilized binary solid solutions or multiple phases of either Ag and In or Au and Sn to directly bond the devices to various substrates FIG. 1 shows the phase diagram for combinations of gold (Au) and tin (Sn). Sn melts at 232° C. and Au melts at 1063° C. A eutectic composition at 29.3 atomic % tin (or 20 wt. % Sn) has a melting point of about 280° C. When a preform with this composition is bought into contact with Au-rich surfaces on the substrates and the device metallization, Sn diffuses rapidly into these surfaces, yielding an overall composition that is Au rich and contains a mixture of solid solution of Sn in Au and ξ, phase. The re-melting is limited to about 498° C. due to low solubility of Sn in Au. Final compositions up to 10 atomic percent Sn are practical in the joints. The labels 1, 2 and 3 on the phase diagram indicate the various stages of evolution of the bond. Alternatively, Au and Sn metals can be bought into contact and when Sn is heated above its melting point, preferably above 420° C. to avoid the intermetallic AuSn, the molten Sn will diffuse into the Au to form a higher melting (498° C.) composition when the Sn concentration is between about 6.8 to about 10 atomic percent. At smaller Sn concentrations, a higher re-melting point can be achieved but this requires large Au volume during processing. The low solubility of Sn in Au and intermetallic formation with the Cu and Ni layers frequently used as interconnects severely limits the thermo-mechanical reliability of the joint under thermal and power cycling.

Figure 2:
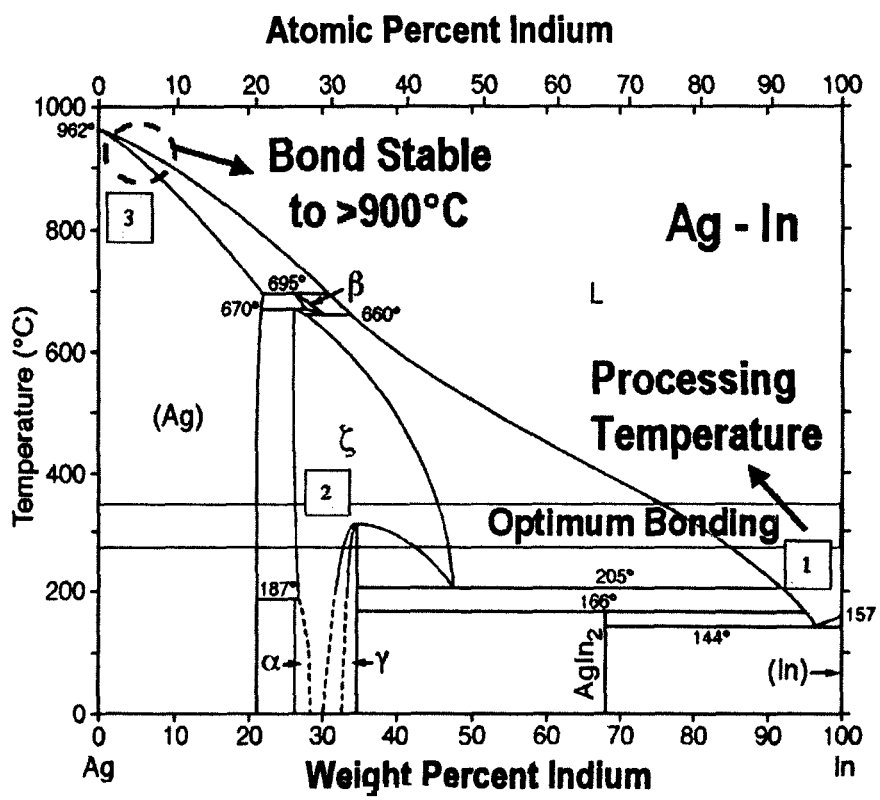
FIG. 2 is a phase diagram showing the melt temperatures of compositions containing In and Ag.

FIG. 2 shows the phase diagram for combinations of silver (Ag) and indium (In). Indium, which has a melting point of 157° C., and silver, which has a melting point of 962° C., form a solid solution up to about 20 atomic percent In (or 21 weight percent). A bond stable to >900° C. can be obtained while processing at about 300° C. or less. However, the solid solution of In in Ag has poor corrosion resistance under voltage bias and high temperatures (>200° C.). The metallic material exhibits migration and evaporation, which are highly undesirable and limit its application.

Figure 3:
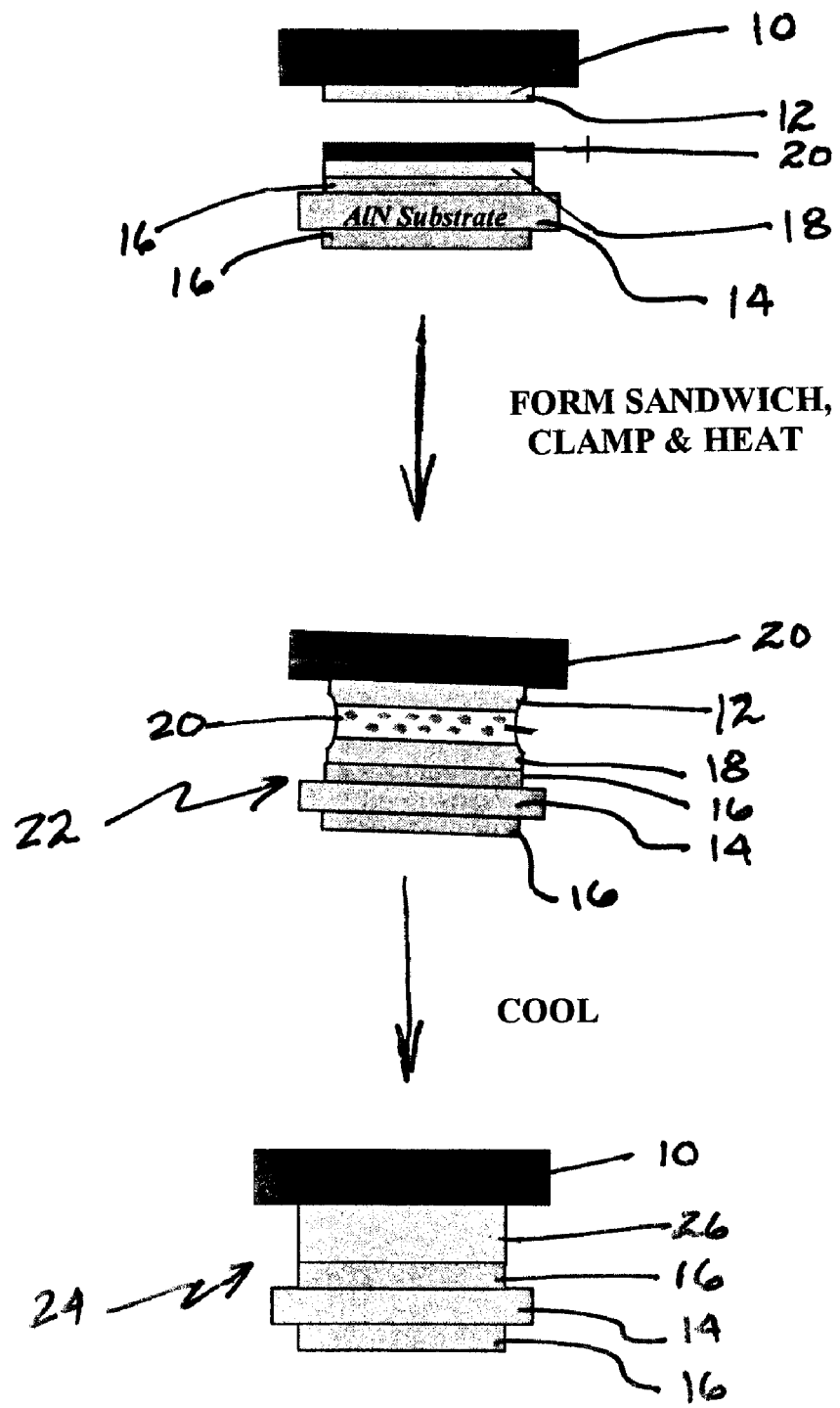
FIG. 3 is a schematic diagram showing the procedure to form a TLP bond between a SiC device and a substrate.

FIG. 3 is a schematic representation of a process incorporating features of the invention. A SiC device 10 is metallized with Ag or Au 12 or both Au and Ag using common metal deposition techniques, such as vapor deposition, electrodeposition, etc. A substrate 14, such as AlN is bonded on the top and bottom surface with a conductor, such as copper 16; then Ag and/or Au 18 is deposited on the copper, again using common deposition techniques. The TLP bonding material 20 is then placed between the coated SiC device 10 and coated substrate 14, the components are brought into contact and clamped together with the TLP bonding material 20 sandwiched between and the assembly 22 is heated. As a result, the TLP bonding material 20 melts transiently, wetting the device and substrate to be joined, diffusing into the coatings and metallizing until the desired alloy of metals is formed. This alloy solidifies into a ternary or quaternary composition 26, which has properties superior to those of solders and binary TLP materials. The TLP bonding material consists of alloys of Au—Sn and/or In—Sn and may be used in the form of a foil or deposited onto the substrate and/or the device. When the assembly 22 is cooled a bonded structure 24 is formed. The solidified interconnect 26 between the SiC device and the substrate has a higher melting point than at least one or more of the metals melted to form the bond because the ultimate thermodynamic composition lies in a region of much higher melting point. The ultimate composition also has higher electrical and thermal conductivity than solders or the TLP bonding material 20 since the ultimate composition is rich in Ag and/or Au. The combination of higher thermal conductivity and a smaller required thickness for the joint 26 provides 3-6 times lower thermal resistance than typical solder or binary TLP materials. The higher re-melting point of the joint 26 gives rise to larger resistance to voiding during thermal and power cycling, due to larger creep resistance, and therefore the lower thermal resistance is maintained over the life of the component. It has been shown that the ternary and quaternary TLP materials outperformed both solders and binary TLP compositions upon thermal cycling of the joint, while retaining their corrosion resistance.

The process is illustrated by the following examples which describe the formation of two alternative compositions that incorporate the features of the invention. However, one skilled in the art will recognize, based on the teachings herein, other metals, compositions, thicknesses, substrates, temperatures, dimensions, etc can be used to accomplish the formation of a high temperature, thermally and electrically conductive, void and creep resistant, corrosion resistant, and lower thermal resistance TLP bond. As part of the process, a metallic composition having a higher melting point than that of the starting materials is formed. Although the examples and illustrations below are described with the example of a SiC power device, the technique is equally applicable to other device types including gallium nitride (GaN) and silicon (Si) or combinations of devices—e.g. Si and SiC. In Si based devices, the following technique and composition offers lower thermal resistance, higher void and corrosion resistance compared to soldered interconnects.

EXAMPLE 1

With reference to FIG. 3, a high temperature and electrically conductive joint is formed in the following manner:

A SiC device with an approximately 2-5 micrometer (μm) layer of Au and/or 25-50 micrometer (μm) of Ag deposited, for example by electrodeposition or other common coating techniques, and a 6-12.5 mil copper layer bonded to a ceramic substrate, such as AlN or $Al_2O_3$ is used. Other substrates such as metal matrix composites and metallic substrates may also be used.

The copper was polished, 1-2 mil Ag was deposited on the copper and 0.08-0.2 mil Au was deposited on Ag, for example by electroplating. An adhesion layer of Ni and Ti (<1 micrometer) is typically used between Cu and Ag. Ag is deposited first on the copper metallized ceramic substrate followed by Au.

A low melting (approximately 300° C.) Au—Sn preform, about 0.5-1 mil thick, (for example, a film of 80/20 weight % or 71/29 atomic % Au/Sn) was sandwiched between the two substrate and SiC device, mild clamping pressure was applied and the assembly was heated to approximately 300-350° C. for about 10-30 min.

The Sn in the melted liquid migrates or diffuses into the Au and Ag layers, rapidly reducing the Sn concentration in the melt, forming a higher melting Au/Sn/Ag ternary composition between the SiC device and the copper coated substrate. The assembled structure was then cooled. If exposed to an elevated temperature the bond thus formed now melts at a temperature >700° C., thus producing a packaged device which can be operated at elevated temperatures. The bond thus formed also possesses the required properties of resistance to voiding during thermal and power cycling, constant temperature exposure, corrosion resistance, low thermal resistance and high electrical conductivity.

EXAMPLE 2

An electrically conductive connection can be formed using indium as follows:

1. Approximately 2-5 micrometer (μm) layer of Au and/or 25-50 micrometer (μm) of Ag deposited, for example by electrodeposition or other common coating techniques, on a SiC device and a 6-12.5 mil copper layer bonded to a ceramic substrate, such as AlN or $Al_2O_3$ is used. Other substrates such as metal matrix composites and metallic substrates may also be used.

2. A preform of 52 weight % In-48 weight % Sn with melting point of 118° C. or 50 weight % In-50 weight % Sn with melting point of 125° C. approximately 0.5-1.0 mils thick is sandwiched between the metallized ceramic or other substrates and SiC device, mild clamping pressure is applied and the assembly is heated to a preferred temperature of 250-350° C. for about 10-30 min. Higher temperature over and above the melting point of the alloy is preferred to avoid thermodynamically stable intermetallic phases and to accelerate diffusion. Alternatively In or In—Sn alloys may be electro- or vapor deposited on the metallized substrates and/or SiC devices with cooling of the substrate to prevent migration of the evaporated indium or In—Sn into the Au and/or Ag coating during this step. Where indium is deposited, a film of tin is deposited as well while providing cooling to the substrate. Cooling of the substrates and/or SiC devices during deposition, particularly when thermal and electron-beam evaporation techniques are used is necessary to prevent diffusion of the evaporated metals due to heating of the substrate and/or device. Cooling, preferably provided by a water-cooled fixture to which the substrates and devices are attached, is typically turned on after about 2-3 minutes of evaporation. This time period allows for sufficient migration of the evaporated metal (In and/or Sn) into the Ag and/or Au metallizations on the substrates and devices to improve adhesion of the subsequent evaporated layers. This technique does not require any performs and may be used to achieve the TLP bond by bringing into contact the substrates and devices with evaporated layers, and heating to 250-350° C. for about 10-30 mm.

The In and Sn migrate into the Ag and/or Au layers, thus forming a higher melting ternary (Ag—In—Sn or Au—In—Sn) or quaternary (Ag—In—Sn—Au) composition between the SiC device and the copper coated substrate. The assembled structure is then cooled. When later exposed to an elevated temperature the ternary or quaternary TLP bond thus formed is stable up to about three times the processing temperature.

While devices stable at higher operating temperatures can be formed using binary Au/Sn or Ag/In TLP bonds, it has been found that devices operable at higher temperatures which are more stable and reliable can be produced by forming ternary or quaternary compositions, of which Ag—Sn—Au, Ag—In—Au, Ag—In—Sn, Au—In—Sn or Ag—In—Sn—Au are the preferred combination, because of the higher solubility of Sn or In in Ag than Au and due to the improved resistance to corrosion and void resistance upon thermal and power cycling. These ternary or quaternary bonded devices also have higher thermal and electrical conductivity.

Figure 4:
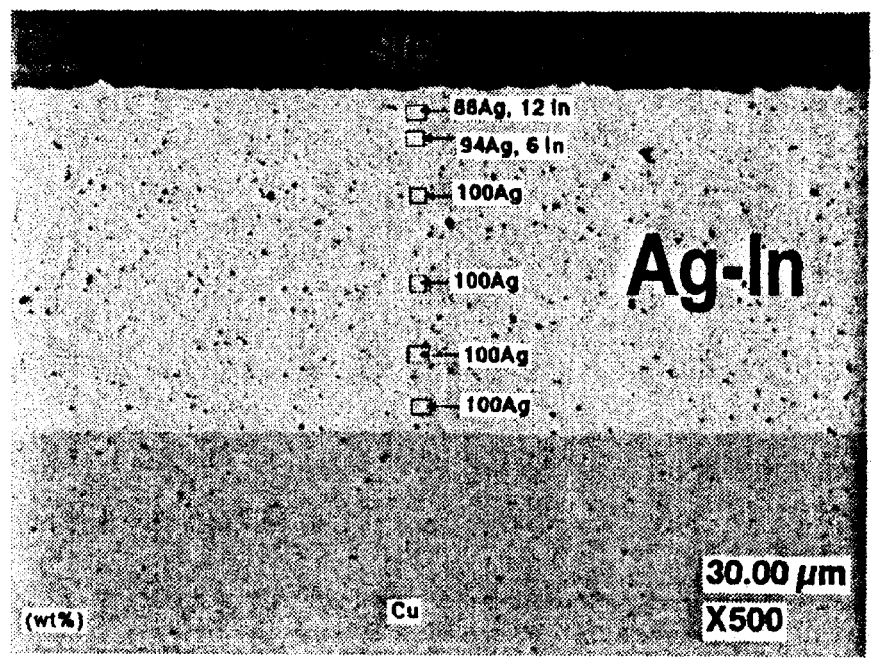
FIG. 4 is a magnified cross sectional view of a bond formed using TLP bonding between a silver coated SiC device and a silver contact on a substrate using a Ag—In TLP.

FIG. 4 is a cross sectional view of a bond formed in a device with a silver coating on copper using a Ag/In composition. While the indium has high solubility in the Ag this combination suffers from severe corrosion under wet or other environmental conditions because Ag readily ionizes and migrates to the negative electrode.

Figure 5:
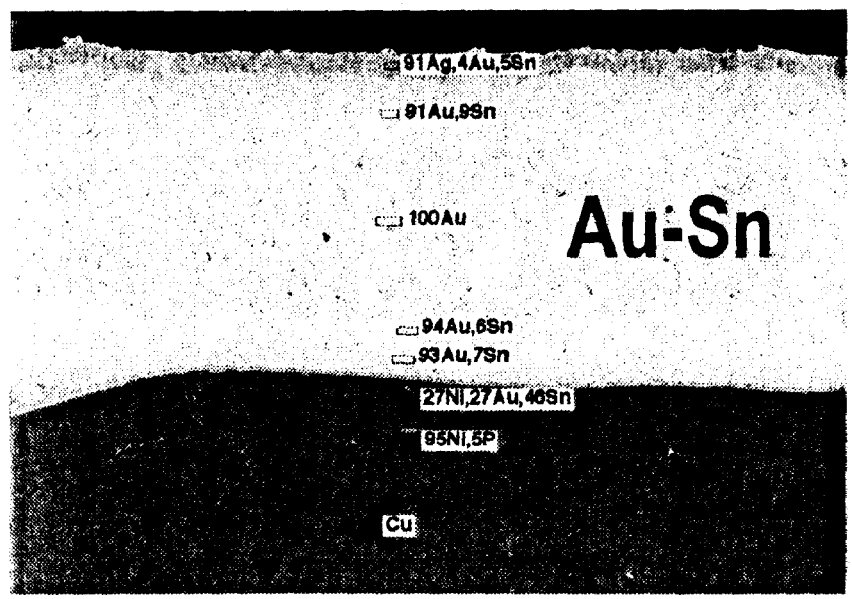
FIG. 5 is a magnified cross sectional view of a bond formed using TLP bonding between a silver coated SiC device and a Ni coated Cu contact on a substrate using a Au—Sn TLP.

FIG. 5 is a cross sectional view of a bond formed in a state of the art device with a Au—Sn TLP bond using a 80Au-20Sn preform and Ni coated Cu on the ceramic substrate. The SiC device contains a thin Ag metallization but the joint is mostly binary TLP bond of Au—Sn composition. The utility of such a bond is limited by the thermo-mechanical stability of the low temperature Au—Sn TLP phase in the joint due to the low solubility of Sn in Au which limits the melting temperature to <500° C. and shows creep failure at about 200-250° C. during thermal and power cycling. Additionally, intermetallic formation is observed with complex phases of Ni—Au—Sn where Ni is present and Cu—Sn—Au where Cu only is present on the substrate. These intermetallic phases are brittle and further limit the thermo-mechanical reliability of the joint. Thermo-mechanical reliability refers to the ability of the joint to resist voiding and creep and plastic deformation under mechanical loading at operating temperatures imposed on the joint by the differences in coefficients of the thermal expansion between the metallized substrates and device. Voiding leads to increase in thermal resistance with time and service that accelerates further voiding by diffusional or other mechanisms.

Figure 6A:
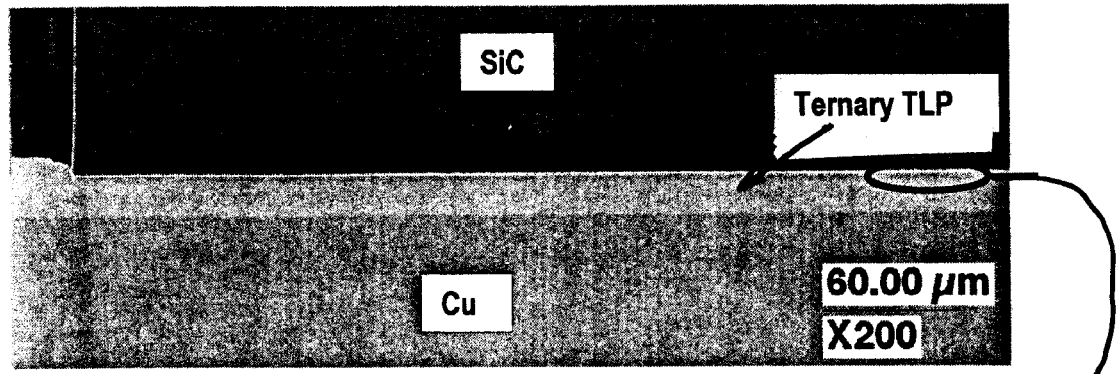
FIGS. 6a and 6b are magnified cross sectional views of a bond formed using TLP bonding between a coated SiC device and a contact on a substrate using a Au—Sn—Ag ternary TLP intermediate composition.
Figure 6B:
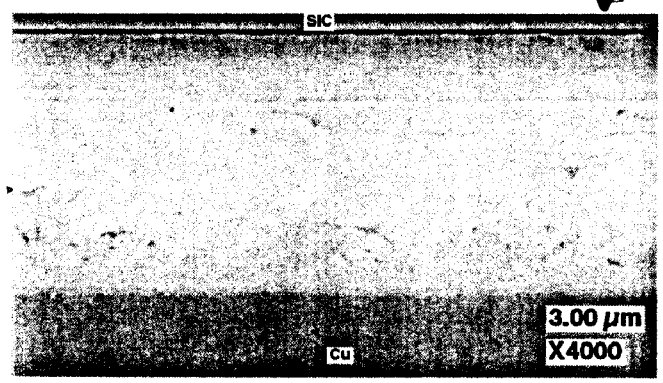

FIG. 6a is a cross sectional view showing the bond between a SiC device and a Cu coating on a substrate using a ternary mixture of Au/Sn/Ag processed at 300° C., said product formed using features of the invention. FIG. 6b is an enlarged view of the circled portion of FIG. 6a. No low temperature phases or intermetallic regions were present. The high uniformity of the binding layer that results provides a ternary composition with a re-melting point in excess of about 800° C. The joints exhibit superior corrosion resistance, thermo-mechanical reliability, electrical and thermal conductivity.

Figure 7:
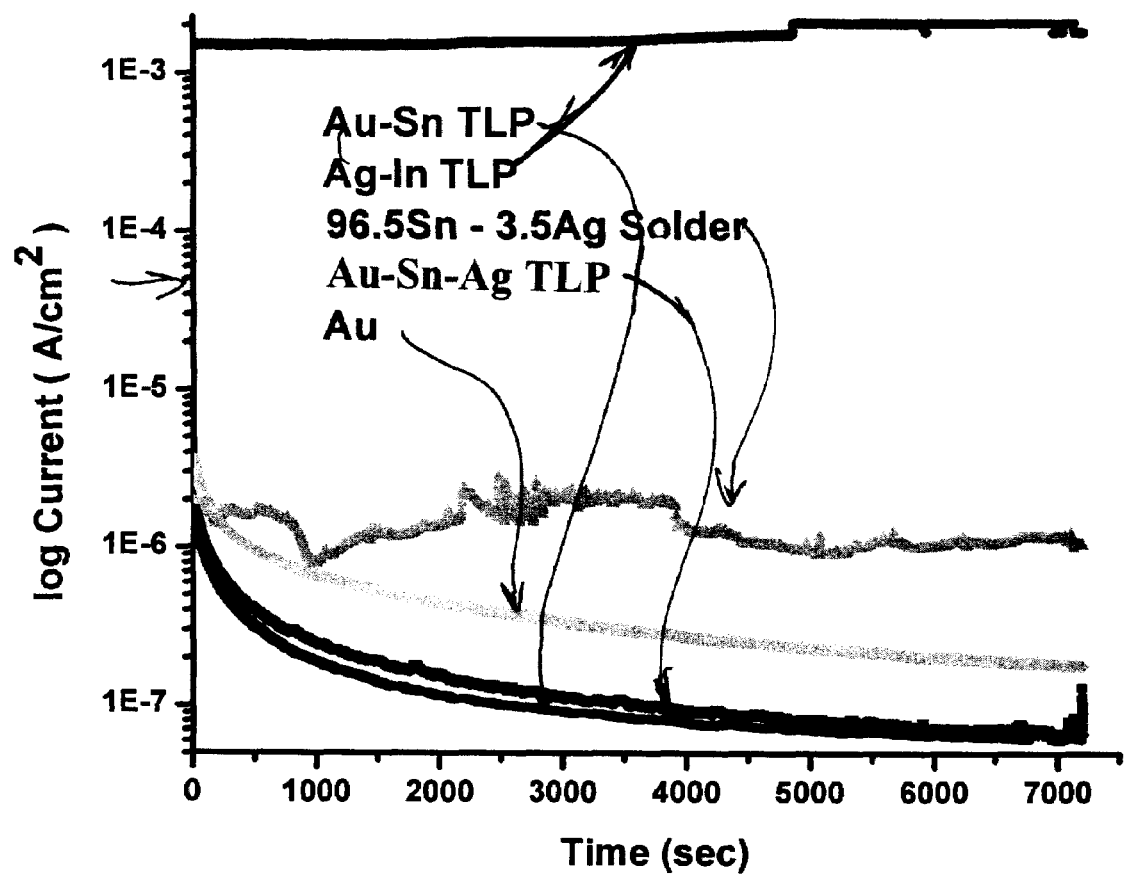
FIG. 7 is a graph comparing the corrosion resistance of a Au—Sn—Ag ternary TLP bond with other metallic bonding systems.

FIG. 7 is graph illustrating the cationic corrosion resistance of 5 different materials used to assemble device packages. The packages were immersed in a NaCl+ammonium sulfate solution and bias voltages were applied to each package. Measuring the current density provides an indication of the tendency of the joint or interconnect materials to form ions under bias when exposed to an electrolyte. Higher current implies rapid corrosion and migration of the cation towards the negative electrode. The Ag—In TLP is the worst joint material in terms of its corrosion resistance. As shown in FIG. 7, the Au—Sn—Ag ternary TLP composition has a cationic migration resistance similar to Au—Sn TLP and better than pure Au. However, as previously indicated, this ternary TLP bond does not have the operation deficiencies exhibited by the binary Au—Sn bond. Because of the higher melting point of the ternary composition, the assembly has a greater creep and void resistance than Au—Sn TLP and a superior thermo-mechanical reliability under temperature or power cycling. Table 1 below compares the corrosion resistance of various joint materials in terms of both anionic and cationic resistance. The ternary Au—Sn—Ag TLP has twice the corrosion resistance of Au—Sn with far superior thermo-mechanical reliability and resistance to voiding. The corrosion resistance of ternary TLP is similar to the popular 96.5Sn-3.5Ag solder, which cannot be reliably used above 200° C. operating temperatures.

| Material System | Corrosion Resistance (MΩ-cm$^2$) |
| --- | --- |
| Ag—In TLP | 0.0725 |
| Au | 0.485 |
| Au—Sn TLP | 0.554 |
| Ternary Au—Sn—Ag TLP | 0.969 |
| Sn—Ag Solder | 1.09 |

Figure 8:
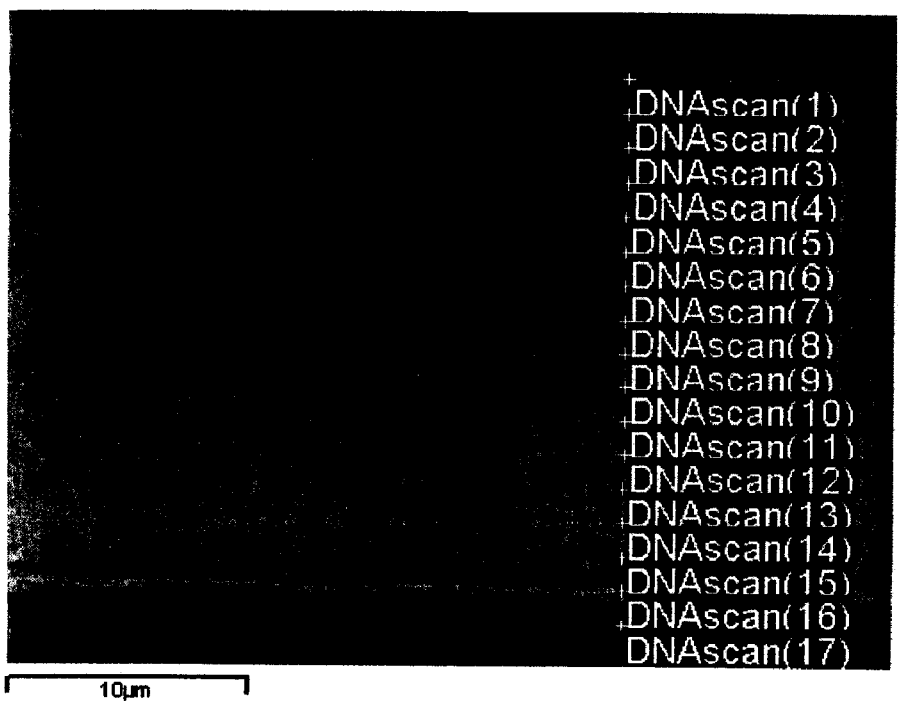
FIG. 8 is a magnified cross sectional view of an example of a bond formed using ternary TLP bonding between a gold coating on a SiC device and silver and gold coatings on a copper coated ceramic substrate using a 80Au-20Sn intermediate with melting point of 280° C., forming a ternary Au—Sn—Ag metal bond, with points of elemental analysis indicated.
Figure 9:
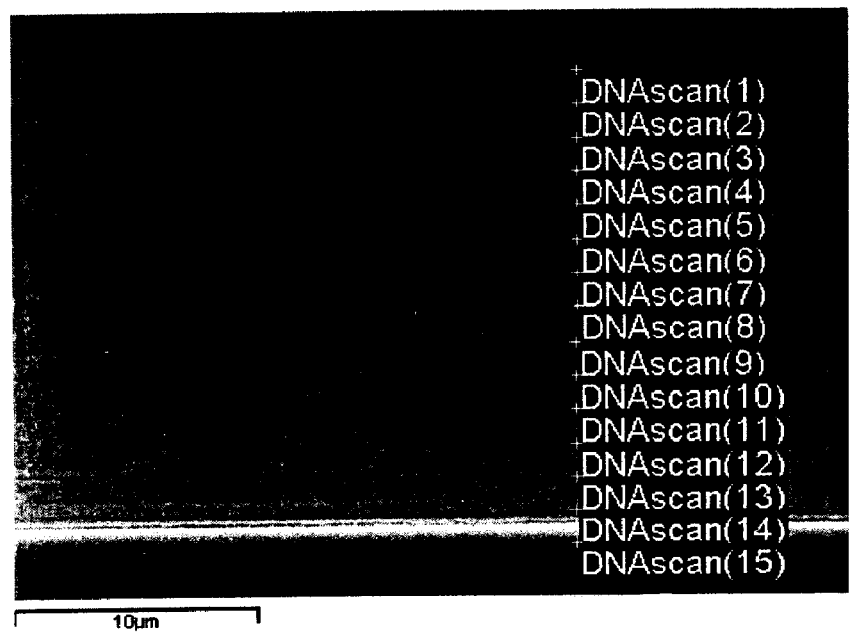
FIG. 9 is a magnified cross sectional view of a second example of a bond formed using quaternary TLP bonding between a gold coated SiC device and a gold and silver coating on copper contact formed on a substrate using a 52In-48Sn intermediate with melting point of 118° C., forming a quaternary Au—In—Sn—Ag metal bond, with points of elemental analysis indicated.

FIGS. 8 and 9 are cross sectional views through the TLP bond portion of two structures formed using features of the invention. FIG. 8 is a magnified cross sectional view showing a bond formed using ternary TLP bonding between a gold coating on a SiC device and silver and gold coatings on a copper coated ceramic substrate using an 80-20 Au—Sn intermediate, forming a ternary Au—Sn—Ag metal bond. Analysis of the concentrations of the elements Au, Sn and Ag at various points across the bond illustrate that the desired composition of Au—Sn—Ag was formed and the uniformity of the distribution of Sn was achieved.

FIG. 9 is a magnified cross sectional view of a second example of a bond formed using quaternary TLP bonding between a gold coated SiC device and silver and gold plated on copper contact formed on a ceramic substrate using a In—Sn preform intermediate, forming a quaternary TLP Ag—Sn—In—Ag metal bond. An elemental analysis across the bond verified the quaternary composition and uniformity of In and Sn in Au and Ag.

FIGS. 10a, 10b and 10c show a comparison of the effect of thermal cycling of a ternary Au—Sn—Ag TLP-packaged SiC diode. The diode consists of four individual die areas to increase the current rating. The acoustic scan of the TLP package as fabricated prior to thermal cycling is shown. Scans after 1000 and 1500 thermal cycles, respectively, between −20° C. and 300° C. were also taken. The acoustic scan of the as-fabricated joint illustrates the excellent bonding between the SiC device consisting of four diode areas on a single SiC die. The lateral dimension of the device is about 0.2". The dark areas indicate voids, grey areas indicate redistribution of the solute (In and Sn) and white areas are unchanged compared to the as-fabricated joint. While there are small areas of voids, their area fraction is not significant compared to the total joint area and as demonstrated in the later figures, no changes in the electrical performance of the device was observed.

Figure 12:
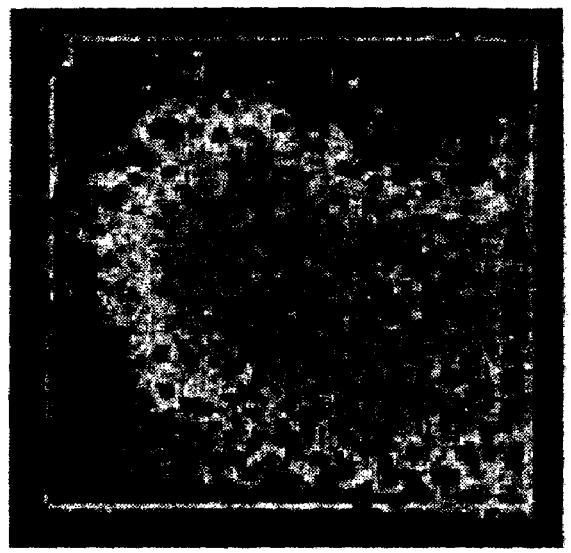
FIG. 12 is an acoustic scan showing a traditional solder packaged SiC diode after 100 thermal cycles between −20° C. and 228° C.
Figure 11B:
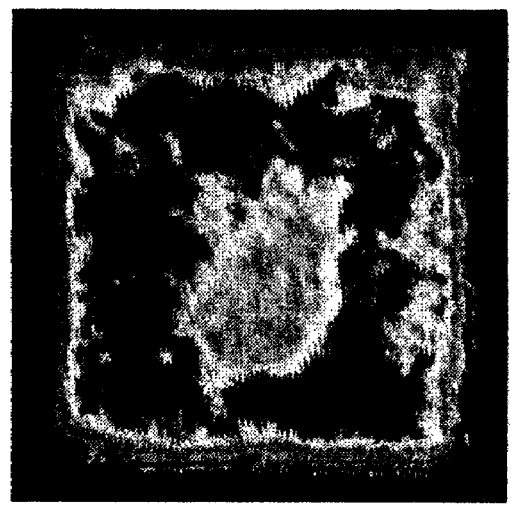
FIGS. 11a and 11b are acoustic scans showing a Au—Sn TLP-packaged cycles, respectively, between −20° C. and 300° C. SiC diode as fabricated and after 1433 thermal cycles between −20° C. and 228° C.
Figure 11A:
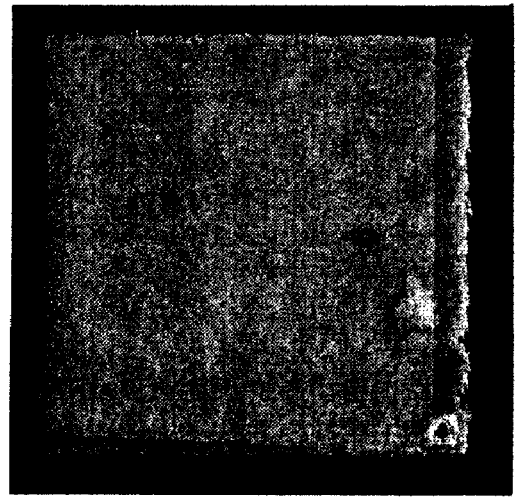

In contrast, FIGS. 11a and 11b are acoustic scans showing a prior art binary Au—Sn TLP-packaged SiC diode as fabricated and after 1433 thermal cycles between −20° C. and 228° C. The upper temperature limit of 228° C. was required by the lower thermo-mechanical reliability of the binary Au—Sn TLP joint as compared to the ternary Au—Sn—Ag joint which incorporates features of the invention (FIG. 10). The large dark areas surrounding the device edges are voids. Significant destruction of the bond has occurred and the device is no longer usable. A large area fraction (>60%) of the joint (as shown by voids) is observed with only the middle portion supporting the current to the device. Even more damage is shown on an acoustic scan showing a traditional solder packaged SiC diode (FIG. 12) after only 100 thermal cycles between −20° C. and 228° C. The solder connected device is totally inoperative.

Figure 13:
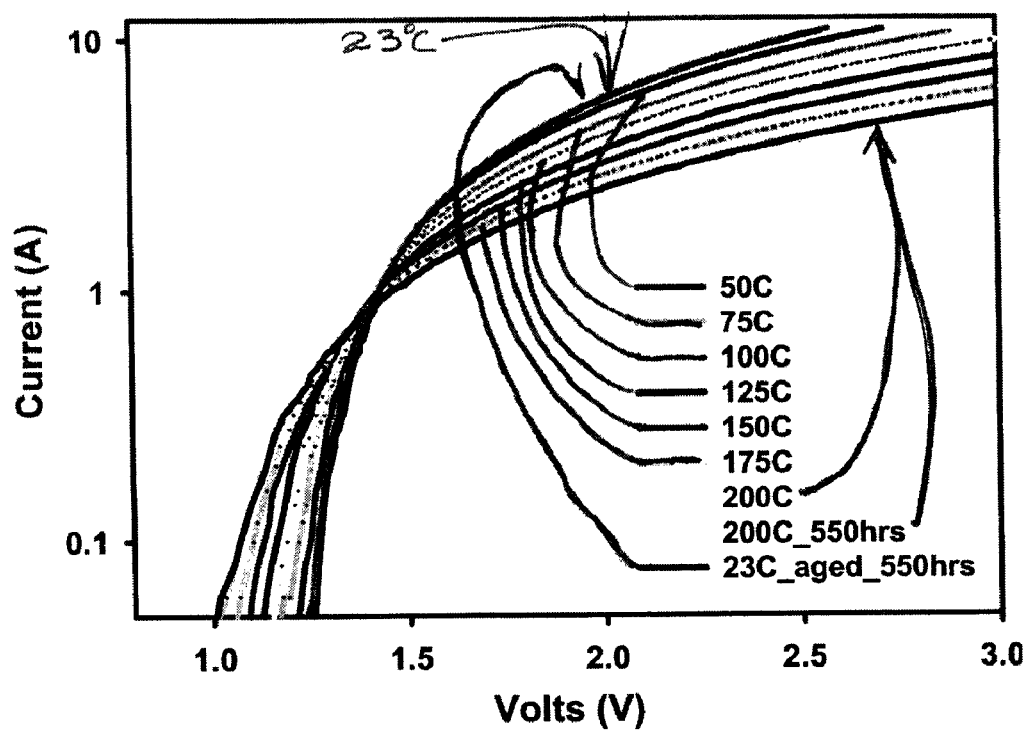
FIG. 13 is a graph showing the current and voltage characteristics of a ternary Au—Sn—Ag TLP-packaged SiC diode tested at various temperatures up to 200° C., held at 200° C. and for up to 550 hours and then returned to room temperature.

FIG. 13 is a graph showing the current and voltage characteristics of a ternary Au—Sn—Ag TLP-packaged SiC diode tested at various temperatures up to 200° C. The right hand lower line shows the electrical characteristics at 200° C. The device was then held at 200° C. for up to 550 hours. The electrical characteristics at 200° C. at zero aging and at 550 hours are unchanged. The device was then returned to room temperature (23° C.) and the electrical characteristics remeasured. They exactly duplicate the 23° C. electrical characteristics measured at the beginning of the study. The different curves are due to the change in electron mobility in the SiC diode at different temperatures and are not a result of the joint in the package. A similar result was obtained with a SiC device exposed to 300° C. for 6375 hours.

Figure 14:
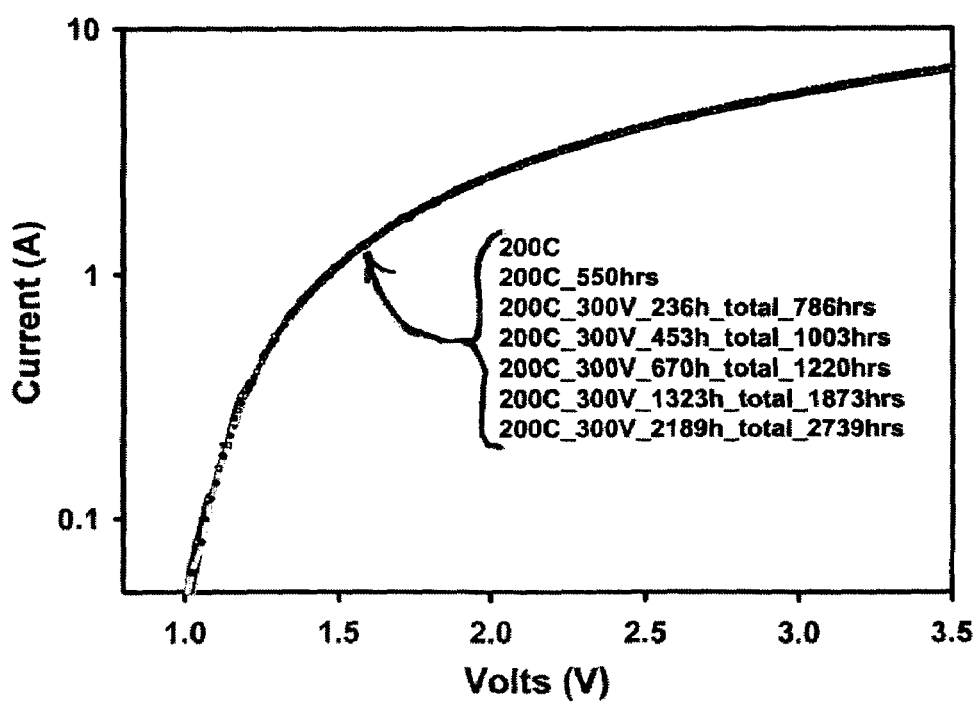
FIG. 14 is a graph showing the absence of change in current and voltage characteristics, when a Au—Sn—Ag ternary TLP-packaged SiC diode was subjected to continuous operation at 200° C. for up to 2739 total hours with 2189 hrs of 300V reverse bias applied to the diode.

FIG. 14 is a graph showing a further elevated temperature aging study of a device prepared according to the teachings herein. A Au—Sn—Ag ternary TLP-packaged SiC diode was subjected to continuous operation at 200° C. for up to 2739 total hours with 2189 hrs of 300V reverse bias applied to the diode at 200° C. No change in electrical characteristics or operational reliability was seen.

Figure 15:
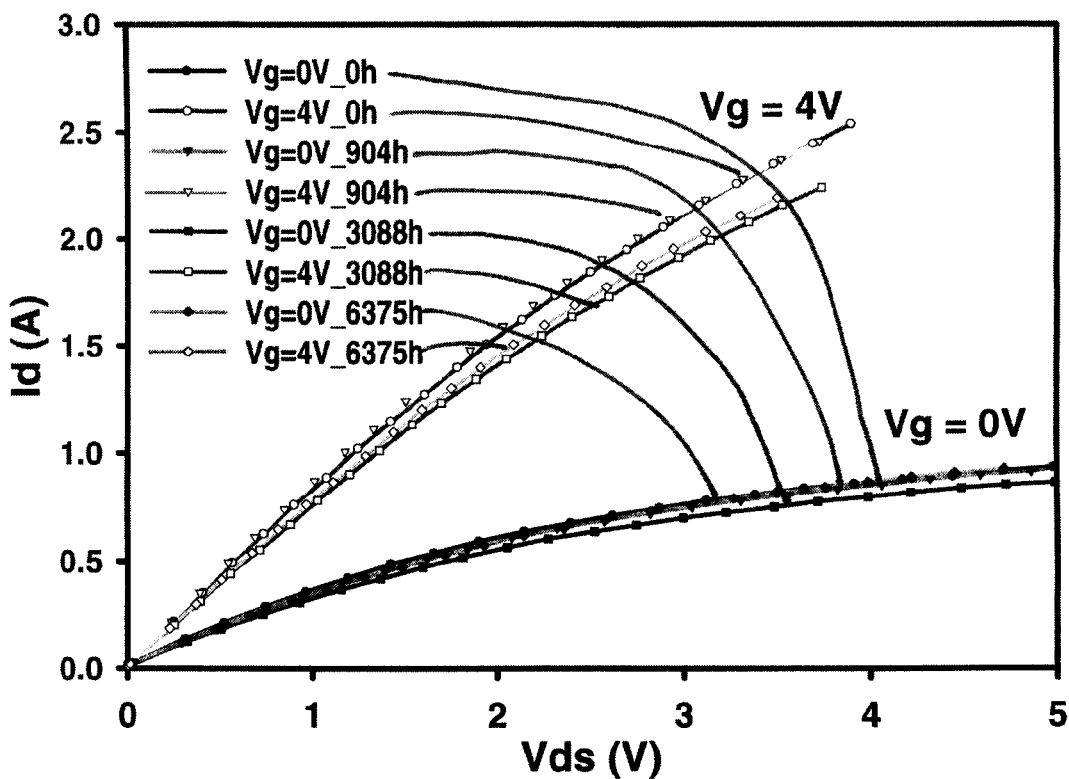
FIG. 15 is a graph showing the current and voltage characteristics, when a quaternary Au—Sn—In—Ag TLP-packaged SiC FET (Field Effect Transistor) was subjected to 0 volts or 4 volts from gate to source at 300° C. for up to 6375 hours.

FIG. 15 is a graph showing the absence of any significant changes in drain current versus drain-to-source voltage characteristics when a quaternary Au—Sn—In—Ag TLP-packaged SiC Field Effect Transistor (FET) was subjected to 0 volts or 4 volts of gate voltage at 300° C. for up to 6,375 hours.

Figure 16:
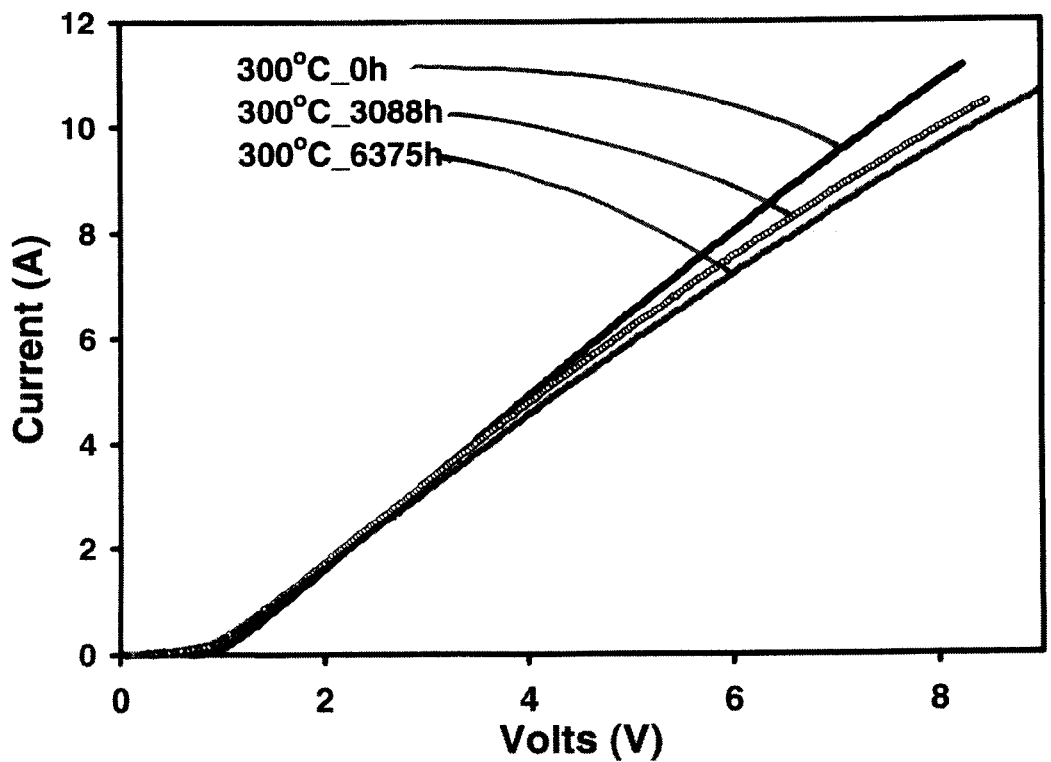
FIG. 16 is a graph showing the current and voltage characteristics, when a quaternary Au—Sn—In—Ag TLP-packaged SiC diode was subjected to 300° C. for up to 6375 hours.

FIG. 16 is a graph showing the absence of any significant change in current and voltage characteristics when a quaternary Au—Sn—In—Ag TLP-packaged SiC diode was subjected to 300° C. tests for up to 6,375 hours.

Figure 17:
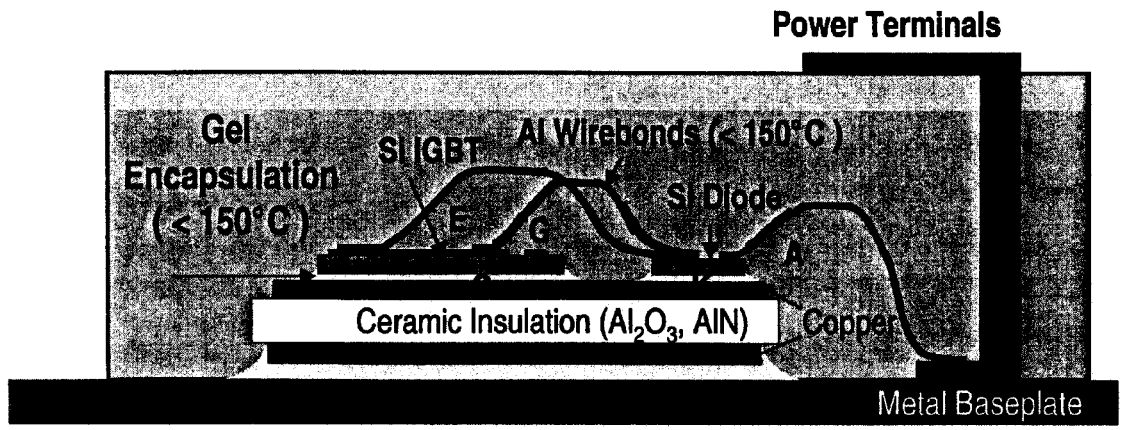
FIG. 17 is a schematic representation of a state of the art solder interconnected power device.
Figure 18:
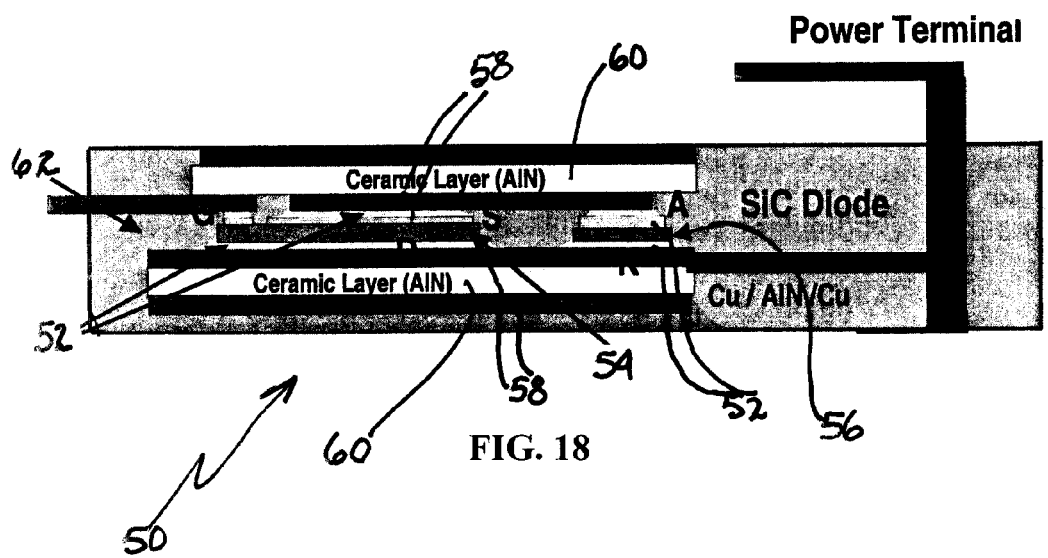
FIG. 18 is a schematic representation of a TLP interconnected power device formed utilizing techniques incorporating features of the invention.

FIG. 17 is a schematic drawing showing an example of a prior art soldered power module including a Si IGBT and Si diode. This basic element is repeated in many power electronic applications. For comparison, FIG. 18 shows an example of a two sided, high reliability all-SiC power module 50 with 350° C. continuous operability formed using ternary or quaternary TLP bonding 52 incorporating features of the invention. The device includes a SiC transistor 54 and a SiC Diode 56 TLP bonded on both the top and bottom to a appropriately metallized copper conductors 58 on ceramic or other substrates 60. The package is then encapsulated in a nonconductive material 62 capable of continuous operation at 350° C. and 300-10 KV blocking voltages.

It has now been demonstrated that packages including SiC devices assembled using ternary or quaternary TLP bonding, particularly using Au, Sn, In and Ag have superior elevated temperature electrical performance, stability and reliability when compared to prior art soldered or binary TLP assembled devices. While the combination of Au, Sn, In and Ag are preferred metals, based on the teachings herein one skilled in the art will recognize that high temperature ternary and quaternary eutectics can be formed from numerous other combinations which include one or more low temperature melting metals and one or more high temperature melting metals which, when combined as taught herein, initially form a melt of the lower temperature melting metal(s) but the alloy or blend after thermodynamic equilibrium having a significantly higher melting temperature and meeting other requirements for a power electronic application.

I claim:

1. A package comprising an electronic component mounted on a conductive coated substrate, the electronic component and the conductive coated substrate bonded by an electrically conductive mixture, the package operable for extended periods of time at temperatures in excess of about 300° C. and under high voltage loads or current flows, wherein:
   the electronic component is a silicon carbide (SiC) device;
   the conductive coated substrate is a copper coated aluminum nitride (AlN) substrate; and
   the electrically conductive mixture comprises at least a ternary mixture or a quaternary mixture having a melting point between a higher melting component of the electrically conductive mixture and a lower melting component of the electrically conductive mixture.

2. The package of claim 1, wherein the higher melting component of the electrically conductive mixture comprises gold or silver or a combination thereof and the lower melting component of the electrically conductive mixture comprises tin or indium or a combination thereof.

3. The package of claim 1, wherein the ternary mixture is a silver-tin-gold alloy, a silver-indium-gold alloy, a silver-indium-tin alloy, or a gold-indium-tin alloy, and the quaternary mixture is a gold-indium-tin-silver alloy.

4. An electrically conductive assembly comprising:
   a first electronic component including a first surface and a first electrically conductive material disposed on the first surface;
   a second electronic component including a second surface, wherein a second electrically conductive material is disposed on the second surface and a third electrically conductive material is disposed on the second electrically conductive material; and
   an electrically conductive interconnect between the first electronic component and the second electronic component, wherein the electrically conductive interconnect has a composition that is a mixture of at least the first electrically conductive material, the third electrically conductive material, and a bonding material positioned between the first surface and the second surface;
   wherein the electrically conductive interconnect has a higher melting point than at least one of the first electrically conductive material, the third electrically conductive material, and the bonding material.

5. The electrically conductive assembly of claim 4, wherein the first electronic component includes silicon carbide and the second electronic component includes an aluminum nitride substrate.

6. The electrically conductive assembly of claim 4, wherein the composition is a ternary or quaternary composition.

7. The electrically conductive assembly of claim 4, wherein the composition is a silver-tin-gold alloy, a silver-indium-gold alloy, a silver-indium-tin alloy, a gold-indium-tin alloy, or a gold-indium-tin-silver alloy.

8. The electrically conductive assembly of claim 4, wherein the first electrically conductive material and the third electrically conductive material include at least one of gold or silver.

9. The electrically conductive assembly of claim 8, wherein the second electrically conductive material further includes copper.

10. The electrically conductive assembly of claim 4, wherein the bonding material is a transient liquid phase bonding material comprising tin and one of gold or indium.

11. An electrically conductive interconnect comprising:
   a first electrically conductive material disposed on a first surface of a first component;
   a second electrically conductive material disposed on a second surface of a second component;
   a third electrically conductive material disposed on the second electrically conductive material; and
   a bonding material configured to bond the first electrically conductive material to the third electrically conductive material to form an interconnect between the first component and the second component, wherein the interconnect comprises a composition that is a combination of the first electrically conductive material, the third electrically conductive material, and the bonding material; and wherein the interconnect has a higher melting point than at least one of the first electrically conductive material, the third electrically conductive material, and the bonding material.

12. The electrically conductive interconnect of claim 11, wherein the first component includes silicon carbide and the second component includes an aluminum nitride substrate.

13. The electrically conductive interconnect of claim 11, wherein the composition includes at least three metals.

14. The electrically conductive interconnect of claim 11, wherein the composition is a silver-tin-gold alloy, a silver-indium-gold alloy, a silver-indium-tin alloy, a gold-indium-tin alloy, or a gold-indium-tin-silver alloy.

15. The electrically conductive interconnect of claim 11, wherein at least one of the first electrically conductive material and the third electrically conductive material comprise at least one of gold or silver.

16. The electrically conductive interconnect of claim 15, wherein the second electrically conductive material further includes copper.

17. The electrically conductive interconnect of claim 11, wherein the bonding material is a transient liquid phase bonding material.

18. The electrically conductive interconnect of claim 11, wherein the bonding material includes tin and one of gold or indium.

* * * * *